United States Patent
Blin (10) Patent No.: US 7,937,120 B2
(45) Date of Patent: May 3, 2011

(54) SYSTEM, APPARATUS AND METHOD FOR FREQUENCY BASED CURRENT REDUCTION IN WIRELESS PORTABLE DEVICES

(75) Inventor: Guillaume Blin, Malden, MA (US)

(73) Assignee: Paratek Microwave, Inc., Nashua, NH (US)

( * ) Notice: Subject to any disclaimer, the term of this patent is extended or adjusted under 35 U.S.C. 154(b) by 955 days.

(21) Appl. No.: 11/788,479

(22) Filed: Apr. 21, 2007

(65) Prior Publication Data

US 2009/0036089 A1   Feb. 5, 2009

(51) Int. Cl.
 *H04B 1/38* (2006.01)
 *H04M 1/00* (2006.01)
(52) U.S. Cl. .................. 455/574; 455/553.1; 455/343.1; 455/343.2; 455/132
(58) Field of Classification Search ............... 455/553.1, 455/574, 343.1, 343.2, 227, 229
See application file for complete search history.

(56) References Cited

U.S. PATENT DOCUMENTS

| | | | | |
|---|---|---|---|---|
| 4,955,075 A * | 9/1990 | Anderson | ............ | 455/182.2 |
| 5,603,106 A * | 2/1997 | Toda | ............ | 455/126 |
| 5,815,821 A * | 9/1998 | Pettersson | ............ | 455/574 |
| 5,903,854 A * | 5/1999 | Abe et al. | ............ | 455/575.1 |
| 5,995,814 A * | 11/1999 | Yeh | ............ | 455/180.1 |
| 6,411,159 B1 * | 6/2002 | Callahan, Jr. | ............ | 327/563 |
| 6,456,887 B1 * | 9/2002 | Dudding et al. | ............ | 607/60 |
| 6,970,040 B1 * | 11/2005 | Dening | ............ | 330/126 |
| 7,016,654 B1 * | 3/2006 | Bugeja | ............ | 455/73 |
| 7,151,914 B2 * | 12/2006 | Brewer | ............ | 455/127.1 |
| 7,245,170 B2 * | 7/2007 | Inamori et al. | ............ | 327/308 |
| 7,266,361 B2 * | 9/2007 | Burdett | ............ | 455/334 |
| 7,295,813 B2 * | 11/2007 | Haub et al. | ............ | 455/67.13 |
| 7,590,395 B2 * | 9/2009 | Buckley | ............ | 455/127.1 |
| 7,627,288 B2 * | 12/2009 | Iida | ............ | 455/41.1 |
| 2001/0006900 A1 * | 7/2001 | Hanninen | ............ | 455/553 |
| 2001/0036816 A1 * | 11/2001 | Wieck | ............ | 455/130 |
| 2002/0167433 A1 * | 11/2002 | Soundarapandian et al. | | 341/155 |
| 2005/0162301 A1 * | 7/2005 | Mizumasa et al. | ............ | 341/162 |
| 2005/0221790 A1 * | 10/2005 | Persico et al. | ............ | 455/343.2 |
| 2008/0039042 A1 * | 2/2008 | Ciccarelli et al. | ............ | 455/234.1 |
| 2008/0284406 A1 * | 11/2008 | Kapusta, Jr. | ............ | 323/318 |

\* cited by examiner

*Primary Examiner* — Duc M Nguyen

(74) *Attorney, Agent, or Firm* — Guntin Meles & Gust, PLC; Andrew Gust (57) ABSTRACT

An embodiment of the present invention provides a method, comprising reducing power consumption in a wireless device by adapting the bias current of active devices in the apparatus to the RF carrier frequency of the wireless device.

12 Claims, 7 Drawing Sheets

SYSTEM, APPARATUS AND METHOD FOR FREQUENCY BASED CURRENT REDUCTION IN WIRELESS PORTABLE DEVICES

BACKGROUND OF THE INVENTION

Wireless devices have become prevalent throughout, society. As users demand more mobility, there is a tremendous requirement for decreasing power consumption and thereby increasing battery life. Further, many wireless devices may transmit on a plurality of carrier frequencies and include circuits dealing with several frequency bands of operation.

It would be highly advantageous to utilize the use of several frequency bands to improve and decrease power consumption. Thus, there is a strong need for a system, apparatus and method for frequency based current reduction in wireless portable devices.

SUMMARY OF THE INVENTION

An embodiment of the present invention provides a method, comprising reducing power consumption in a wireless device by adapting the bias current of active devices in the apparatus to the RF carrier frequency of the wireless device. The active devices may include analog, RF or mixed signal circuits and the resistances of different values may be switched to keep a constant gain or drop voltage when the bias current flowing through them is modified. Further, the components with which the current is modified may include: gain amplifiers, limiters, full-wave rectifiers, buffers, logarithmic amplifiers (power detectors), mixers, VCO, LNA.

Another embodiment of the present invention may provide an apparatus, comprising a wireless device adapted to reduce power consumption by adapting the bias current of active devices in the apparatus to the RF carrier frequency of the wireless device. The active devices in the apparatus may include analog, RF or mixed signal circuits and the resistances of different values may be switched to keep a constant gain or drop voltage when the bias current flowing through them is modified. Further, the components with which the current is modified may include: gain amplifiers, limiters, full-wave rectifiers, buffers, logarithmic amplifiers (power detectors), mixers, VCO, LNA.

Still another embodiment of the present invention provides a method, comprising reducing power consumption in a wireless device by configuration of passive devices in the wireless device to the RF carrier frequency of the wireless device.

Yet another embodiment of the present invention provides a method, comprising reducing power consumption in a wireless device by adapting the operation frequency of digital, mixed signal or switching circuits to the RF carrier frequency of the wireless device. The digital or mixed signal circuits may adapt the internal clock frequency or optimize the number of cycles or calculation per second. Further, the wireless device may include a closed loop antenna tuner wherein the clock frequency may be reduced for lower RF operation frequencies of the carrier because the antenna is less sensitive to the environment at lower frequencies.

Yet another embodiment of the present invention provides an apparatus, comprising a wireless device adapted to reduce power by adapting the operation frequency of digital, mixed signal or switching circuits to the RF carrier frequency of the wireless device. The digital or mixed signal circuits of this apparatus may adapt the internal clock frequency or optimize the number of cycles or calculation per second.

Still another embodiment of the present invention provides a method, comprising reducing power consumption in a wireless device by adapting the voltage supplies of circuits within the wireless device to the RF carrier frequency of the wireless device. The voltage supplies may drive RF switches to the RF carrier frequency of the wireless device. Further, the supply voltage may be adjusted dynamically within the same band of operation, to accommodate the need of the tunable devices.

Still another embodiment of the present invention provides an apparatus, comprising a wireless device adapted to reduce power consumption by adapting the voltage supplies of circuits within the wireless device to the RF carrier frequency of the wireless device. The supply voltage may be adjusted dynamically within the same band of operation, to accommodate the need of the tunable devices.

Still another embodiment of the present invention provides a method, comprising reducing power consumption in a wireless device by adapting the efficiency of DC/DC converters to the RF carrier frequency of the wireless device and dynamically adapting both output voltage and output current to optimize the power consumption. Further, this method may further comprise generating the minimum supply absolutely required to bias variable capacitors or MEMS and adapting it to the need of the wireless device to further reduce the power consumption by increasing the conversion efficiency.

Still another embodiment of the present invention provides an apparatus, comprising an antenna tuner adapted to reduce power consumption by adapting the operating frequency of digital, mixed signal and switching circuits to the radio frequency (RF) carrier frequency.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

An embodiment of the present invention provides a method to dynamically optimize the average power consumption of different analog or RF or mixed signal or digital block as a function of the frequency of the RF carrier used by a wireless application. The frequency of the carrier may be determined on chip by monitoring a VCO control voltage or a PLL output or any other method, or can be defined by an input signal provided by the application itself. Typically the signal can be the "Band Select" signals in portable wireless applications, such as cell phones or PDAs, although the present invention is not limited in this respect.

The carrier frequency may be modified any time in the system or in the application and the circuit may then be optimized according to the new carrier frequency. The power consumption of any application depends on four main parameters: 1) the quiescent current consumption (for analog, mixed signal and RF circuits); 2) the clock frequency (for digital, mixed signal and switching circuits); 3) the supply voltage (for all cases); and the power conversion efficiency (for power management circuits with DC/DC conversion).

An embodiment of the present invention provides for the reduction of power consumption by adapting the bias current of analog, RF and mixed signal application to the RF carrier frequency. The active electronic devices such as, but not limited to, the bipolar transistors, the MOS transistors, the HBT transistors have electrical characteristics over frequency that vary respect to their bias current. By properly adapting the bias current of these devices to the operation frequency, current can be efficiently optimized. Typically, active devices require more bias current at higher frequencies than at lower frequencies to reach the same level of performance (such as amplification gain). The present invention may apply different bias current for different RF carrier frequencies. The passive devices may need to be actively modified as well to accommodate the change of bias current. For instance, resistances of different values could be switched to keep a constant gain or drop voltage when the bias current flowing through them is modified. Exemplary blocks to which the invention applies are gain amplifiers, limiters, full-wave rectifiers, buffers, logarithmic amplifiers (power detectors), mixers, VCO, LNA. However, it is understood that the present invention is not limited to these examples.

A further embodiment of the present invention provides reduction of power consumption by adapting the operation frequency of digital, mixed signal and switching applications to the RF carrier frequency. The clock frequency of digital or mixed signal system is a major factor in current consumption. As the clock frequency increases, the current consumption increases proportionally. By knowing the carrier frequency, the digital or mixed signal circuits can adapt the internal clock frequency or optimize the number of cycles or calculation per second. For instance, and not by way of limitation, in a closed loop antenna tuner, the clock frequency or the algorithm as well as the number of retuning per second can be reduced for lower RF operation frequencies of the carrier because the antenna is less sensitive to the environment at lower frequencies. As changes in matching are more slow and smaller in value for lower frequencies, the antenna does not required retuning as frequently and the algorithm can be slowed down or put in standby more often.

Another embodiment of the present invention provides reduction of power consumption by adapting the voltage supplies to the RF carrier frequency. Power supply voltage can be also be optimized. This is a common purpose of any power management system controlling microprocessors, LED drivers and so forth. The purpose of an embodiment of the present invention is to extend it further by dynamically adapting the voltage supply to the RF frequency band of operation. This is particularly suitable to applications driving RF devices such as RF switches (MEMS or transistors) or tunable devices such as varactors or variable capacitors. Typically, variable capacitors or MEMS switches used to realize tuners do not need the same maximum tuning voltage for all bands of operation. The generation of the supply for these devices can be thus adapted to each band, optimizing the power consumption of each band. Also, in case of adaptive tuners, the supply voltage could be adjusted dynamically within the same band of operation, to accommodate the need of the tunable devices. The present invention would ensure that the minimum necessary supply is generated at all times and reduced when possible.

Still another embodiment of the present invention provides reduction of power consumption by adapting efficiency of DC/DC converters to the RF carrier frequency. Efficiency of DC/DC converters depend on the ratio of output voltage to input voltage and depends as well as on the output current. Dynamically adapting both output voltage and output current can optimize the power consumption. A typical example in wireless applications is the bias of varactors or MEMS such as RF switches described above. Beside the reduction of the voltage supply and thus power consumption, the efficiency of a converter tends to drop with the output voltage to input voltage ratio. Generating the minimum supply absolutely required to bias variable capacitors or MEMS and adapting it to the need may further reduce the power consumption by increasing the conversion efficiency.

Figure 1:
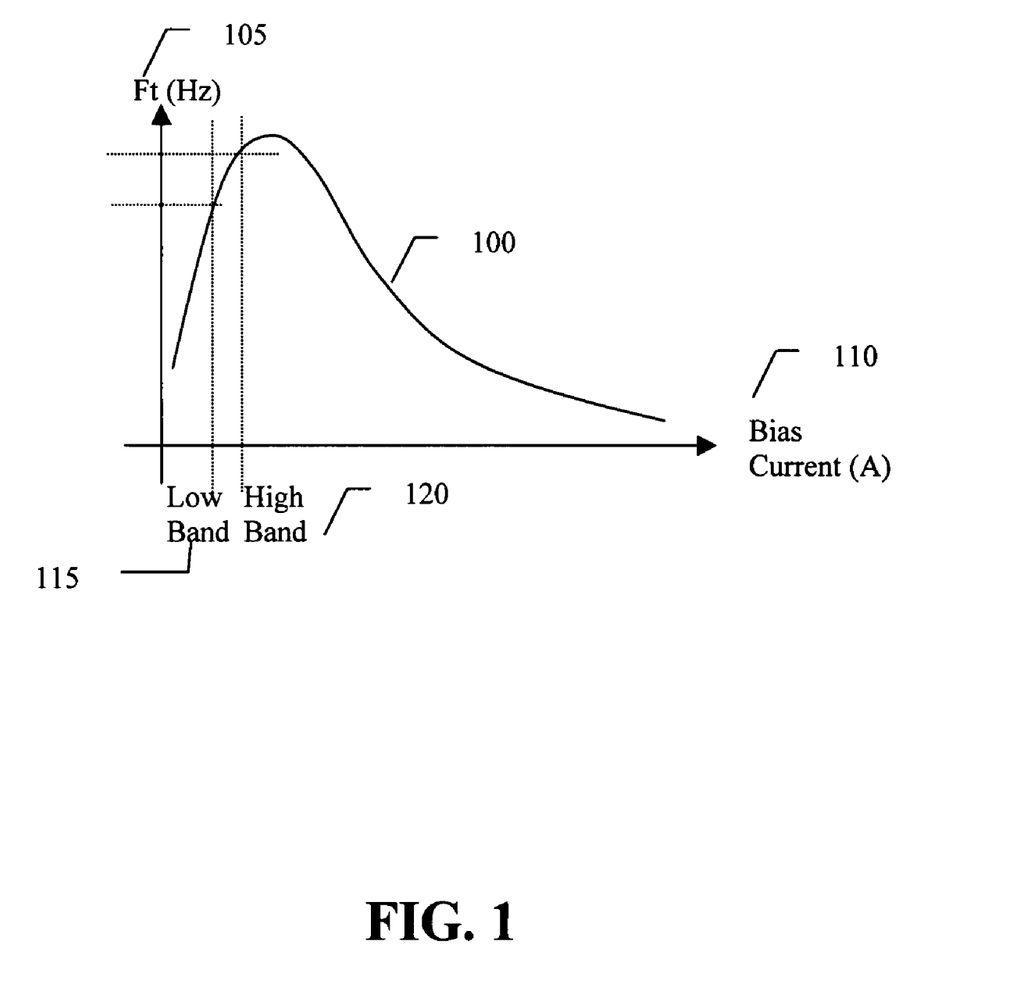
FIG. 1 illustrates a typical cut off (transition) frequency Ft of active devices as a function of bias current of an embodiment of the present invention.

Turning now to the figures, FIG. 1 provides generally at 100, a typical cut off (transition) frequency Ft 105 of active devices as a function of bias current 110 with low band 115 and high band 120 of an embodiment of the present invention. For proper functionality, the devices of a circuit must be biased to have a cut-off frequency above the highest desired operating frequency. For lower operating frequencies of RF blocks (low band 115), the devices can be biased at a lower level compared to at higher frequency (high band 120) for the same level of performance.

Figure 2:
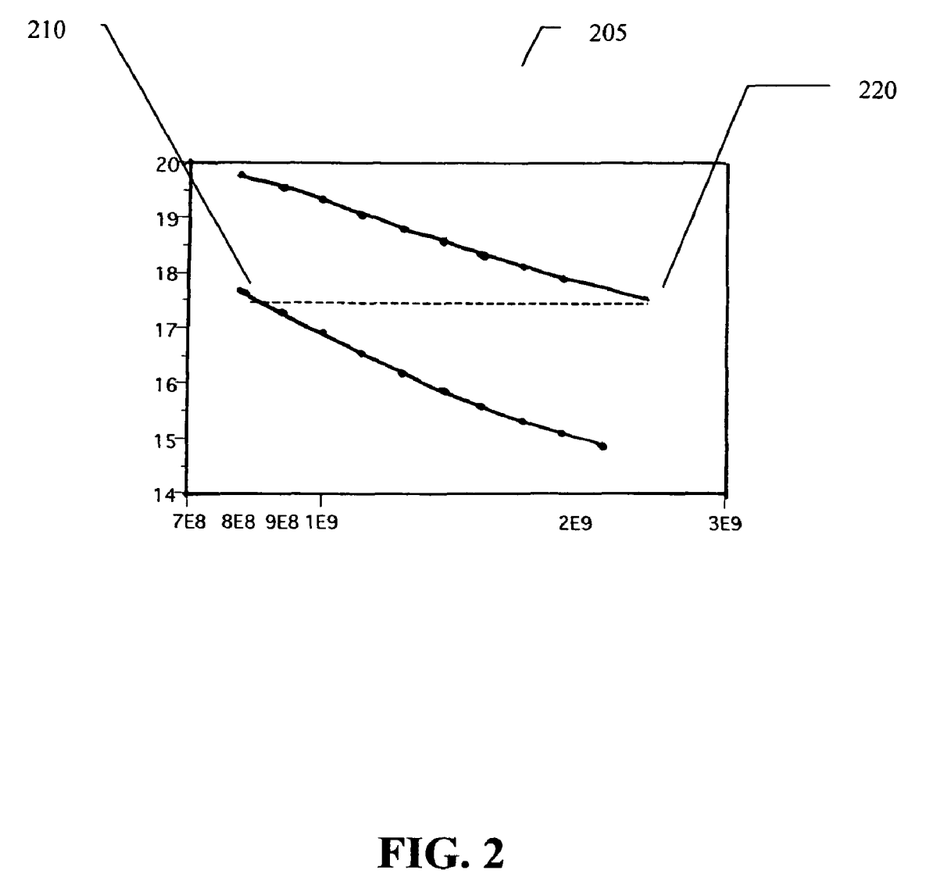
FIG. 2 depicts an adaptive bias in an amplifier of an embodiment of the present invention.
Figure 3:
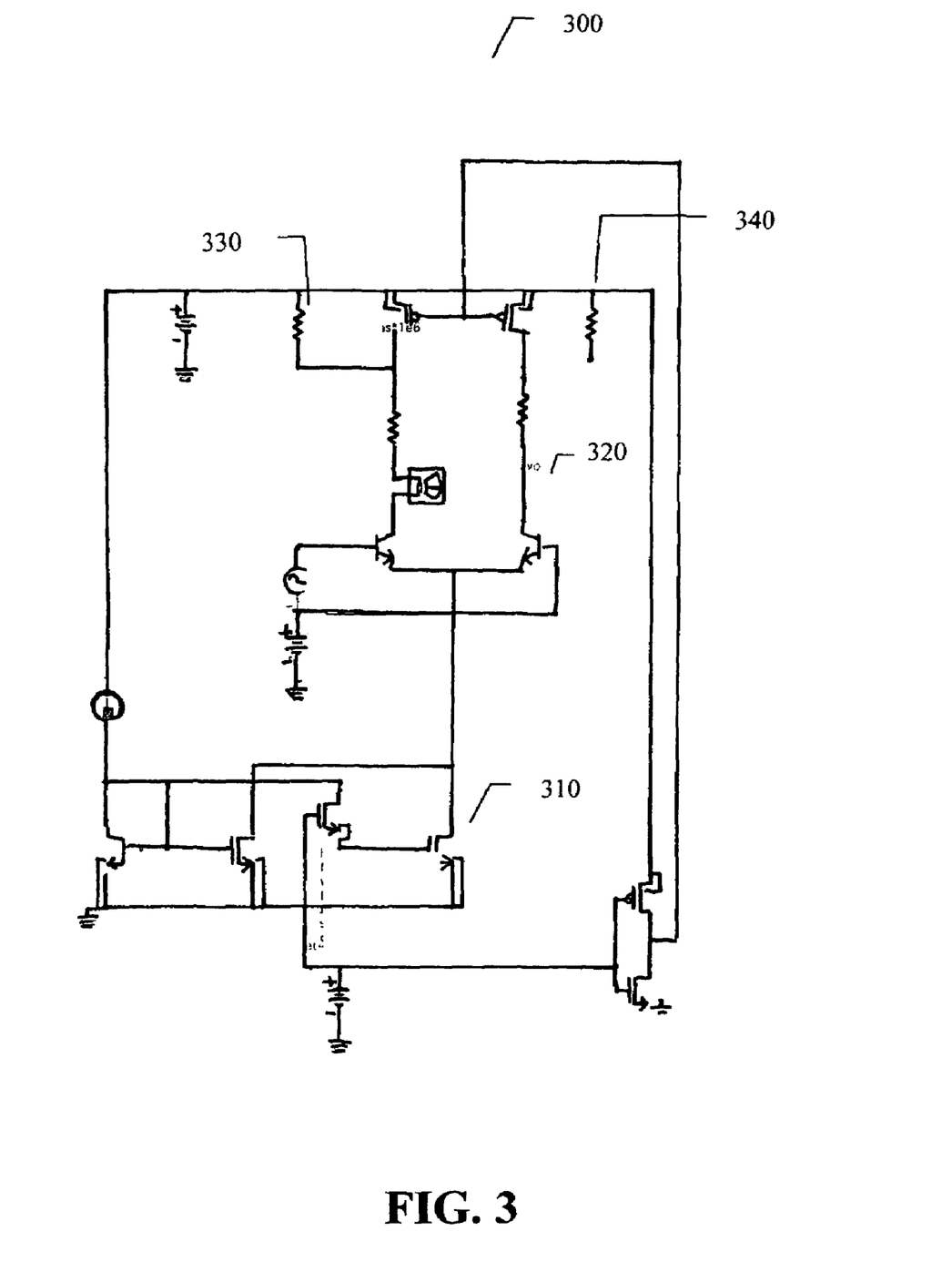
FIG. 3 illustrates an RF block (amplifier) with biasing current depending on the frequency band of operation of one embodiment of the present invention.

As shown in FIG. 1, the high band 120 requires more current to keep the margin between the operating frequency and the cut-off frequency of the devices. On the other end, for the low band 115, the current can be reduced and still keep margin between the operating frequency in the low band 115 and the cut-off frequency of the devices. The cut-off frequency of a device is defined at the point where the gain becomes unitary A practical example is shown FIG. 2 at 200 where the simple amplifier 300 depicted in FIG. 3 has the same gain at 800 MHz (BS=0) 210 and at 2.4 GHz(BS=1) 220 but the biasing current is 30% lower at low frequency respect to high frequency. The bias current is increased by turning on and off part of the current sources (M5) 310. The output bias point Vo 320 is kept constant by switching the load resistors R1 330 and R4 340 with MOS switches. The switches and the programmable current source are controlled by the control signal Band Select. It is understood that the amplifier of FIG. 3 is intended to illustrate the principle of frequency adaptive bias current but different blocks and different schemes can be used as well and still be within the scope of the present invention.

Figure 4:
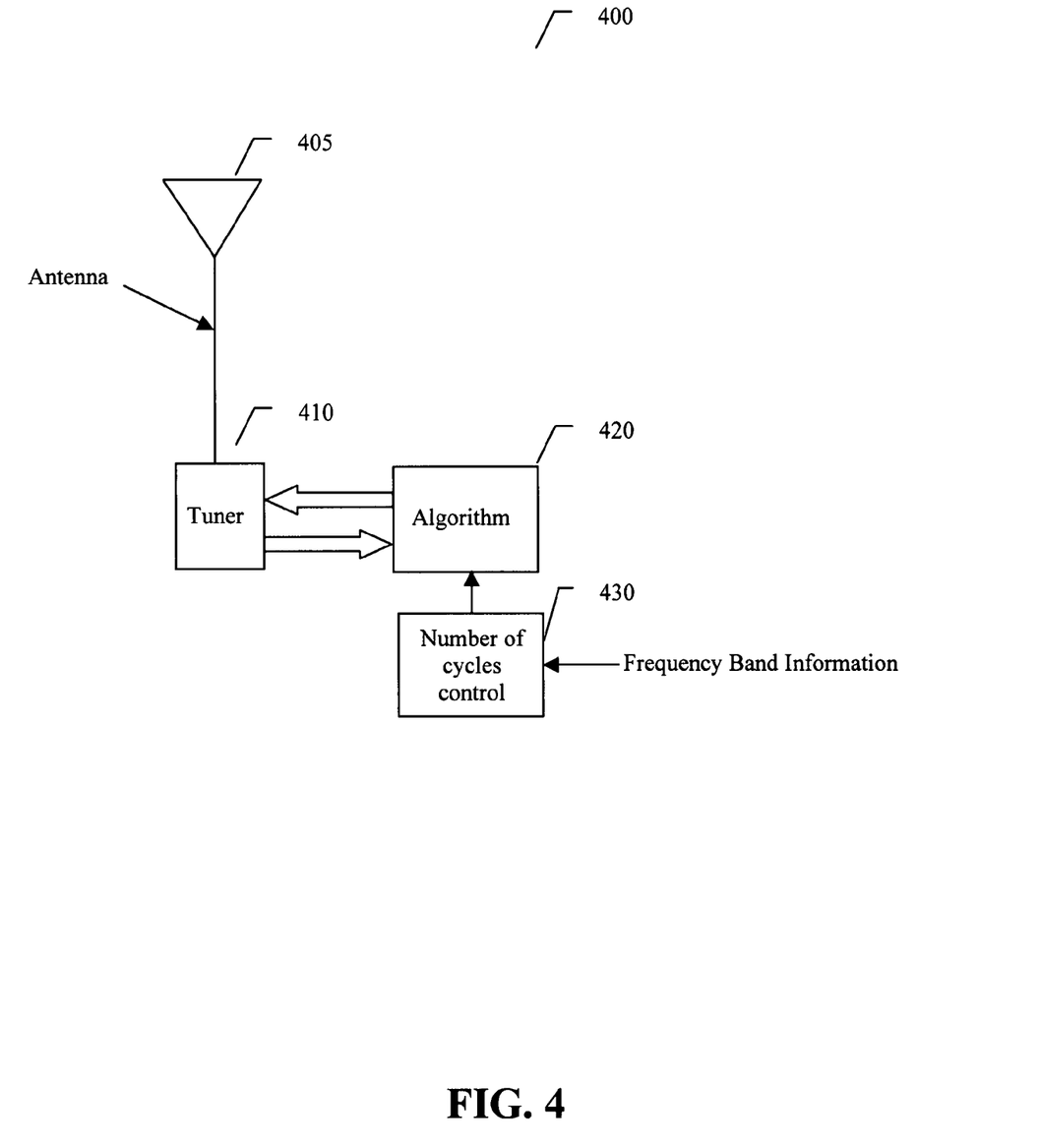
FIG. 4 illustrates an automatic tuner for an antenna application of an RF frequency dependant algorithm of one embodiment of the present invention.

FIG. 4 at 400 illustrates an automatic tuner for an antenna application of an RF frequency dependant algorithm of one embodiment of the present invention. Automatic tuner 500 may include antenna 505 connected to tuner 510 utilizing algorithm 520 which receives frequency band information with number of cycles control.

Figure 5:
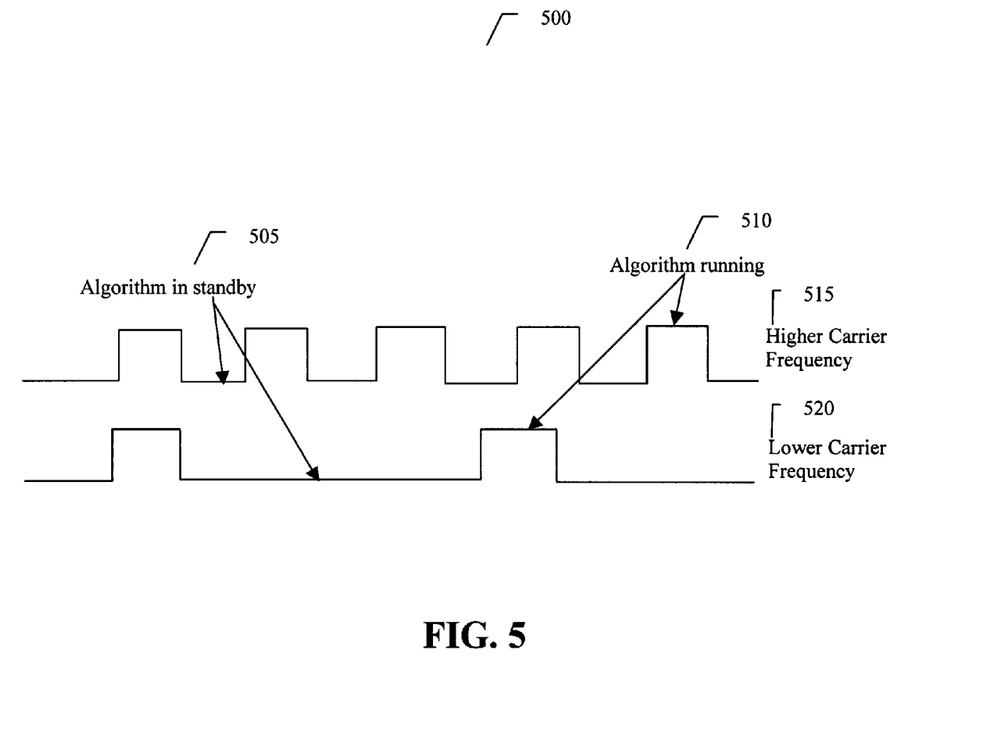
FIG. 5 illustrates the calculation of power savings for different RF carrier frequencies of one embodiment of the present invention.

At FIG. 5, shown generally at 500, is an illustration of the calculation of power savings for different RF carrier frequencies of one embodiment of the present invention. The algorithm in standby mode is shown at 505 and algorithm running is at 510. Higher carrier frequency is depicted at 515 with lower carrier frequency 520. With the decreased frequency illustrated in 520 the potential power savings is readily apparent.

Figure 6:
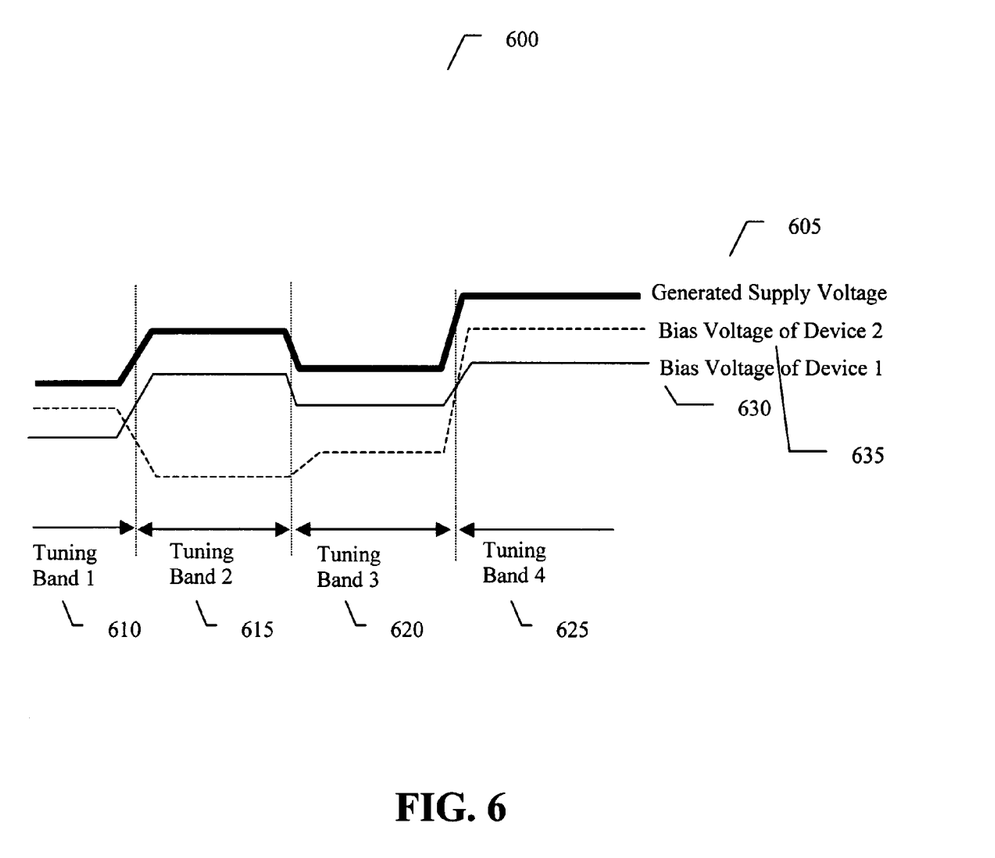
FIG. 6 illustrates an example of Voltage Supply Optimization in a Multi band Environment of one embodiment of the present invention.

FIG. 6 illustrates an example of Voltage Supply Optimization in a Multi band Environment of one embodiment of the present invention. By looking at the generated supply voltage 605 in comparison to bias voltage of device 2 635 and bias voltage of device 1 630 in tuning band 1 610, tuning band 2 615, tuning band 3 620 and tuning band 4 625, the voltage supply optimization incorporated some embodiments of the present invention are demonstrated.

Figure 7:
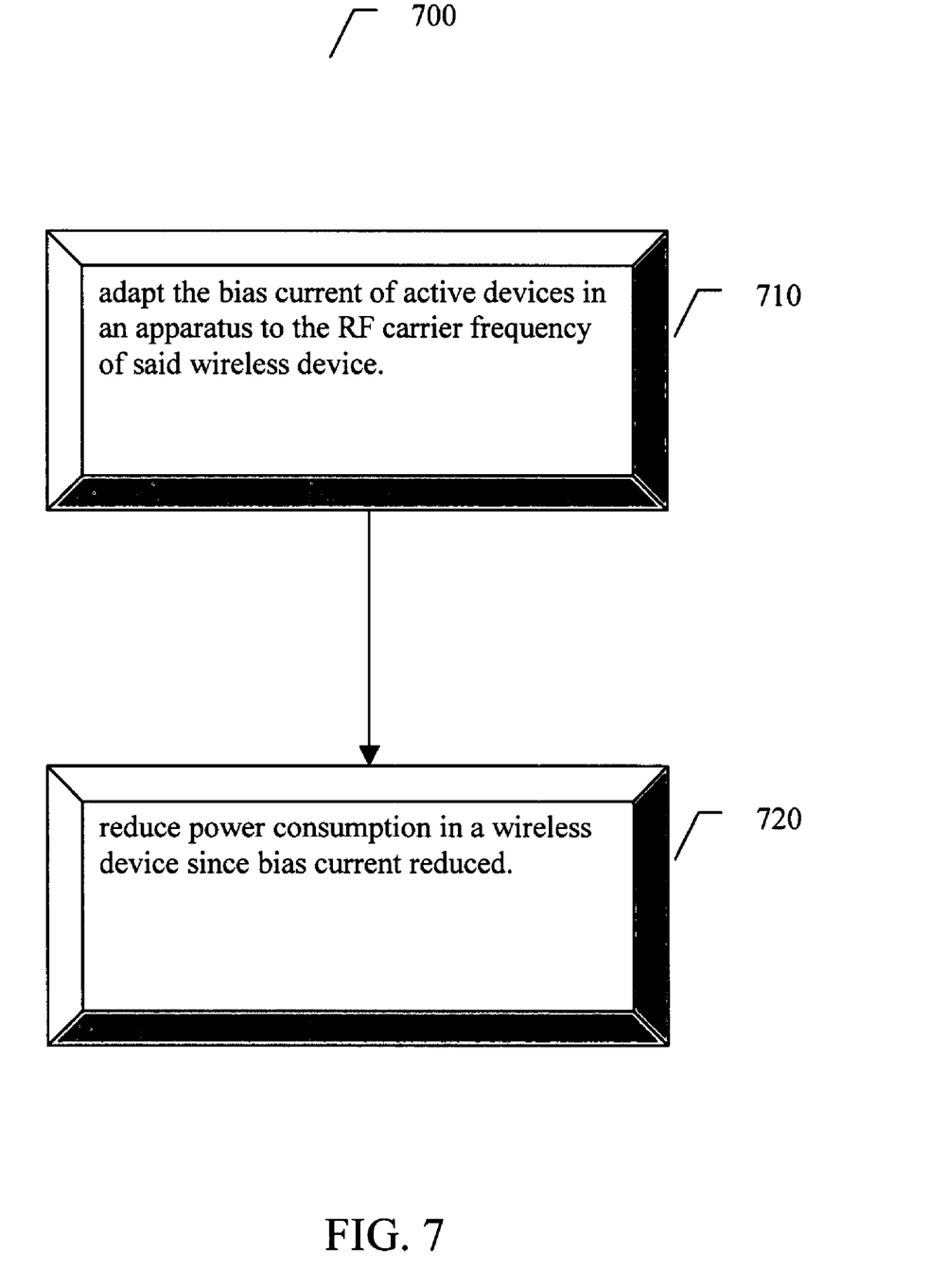
FIG. 7 illustrates a method according to one embodiment of the present invention.

Looking now to FIG. 7 is a flowchart depicting the method according to one embodiment of the present invention. This embodiment of the present invention provides a method, comprising reducing power consumption in a wireless device 720 by adapting the bias current of active devices 710 in the apparatus to the RF carrier frequency of the wireless device. The active devices may include analog, RF or mixed signal circuits and the resistances of different values may be switched to keep a constant gain or drop voltage when the bias current flowing through them is modified. Further, the components with which the current is modified may include: gain amplifiers, limiters, full-wave rectifiers, buffers, logarithmic amplifiers (power detectors), mixers, VCO, LNA.

While the present invention has been described in terms of what are at present believed to be its preferred embodiments, those skilled in the art will recognize that various modifications to the disclose embodiments can be made without departing from the scope of the invention as defined by the following claims.

What is claimed is:

1. A method, comprising:
    determining an RF carrier frequency of a wireless device;
    reducing power consumption in the wireless device by adjusting the bias current of active devices in the wireless device based on the RF carrier frequency of said wireless device; and
    switching between a plurality of components having different resistance values to maintain a constant gain or drop voltage when adjusting the bias current.

2. The method of claim 1, wherein said active devices include analog, RF or mixed signal circuits.

3. The method of claim 2, wherein components with which the current is modified include: gain amplifiers, limiters, full-wave rectifiers, buffers, logarithmic amplifiers, mixers, VCO, LNA.

4. The method of claim 1, wherein the plurality of components are resistors, and wherein the switching is performed using MOS switches.

5. An apparatus, comprising:
    active devices;
    a plurality of components having different resistance values; and
    a wireless device, wherein a bias current of the active devices is adjusted based on an RF carrier frequency of the wireless device to reduce the power consumption of the apparatus, and wherein a constant gain or drop voltage is maintained when adjusting the bias current by switching between the plurality of components having different resistance values.

6. The apparatus of claim 5, wherein said active devices include analog, RF or mixed signal circuits.

7. The method of claim 6, wherein components with which the current is modified include: gain amplifiers, limiters, full-wave rectifiers, buffers, logarithmic amplifiers, mixers, VCO, LNA.

8. The apparatus of claim 5, wherein the plurality of components are resistors, and wherein the switching is performed using MOS switches.

9. An apparatus, comprising:
    at least one active device;
    a plurality of components having different resistance values; and
    a controller connectable with a wireless device to obtain an RF carrier frequency of the wireless device and to adjust a bias current of the at least one active device based on the RF carrier frequency whereby power consumption of the wireless device is reduced, wherein a constant gain or drop voltage is maintained when adjusting the bias current by switching between the plurality of components having different resistance values.

10. The apparatus of claim 9, wherein the at least one active devices include analog, RF or mixed signal circuits.

11. The apparatus of claim 9, wherein the plurality of components are resistors, and wherein the switching is performed using MOS switches.

12. The apparatus of claim 9, wherein components with which the current is modified include: gain amplifiers, limiters, full-wave rectifiers, buffers, logarithmic amplifiers, mixers, VCO, LNA.

* * * * *